US007705596B2

(12) United States Patent
Witschey et al.

(10) Patent No.: US 7,705,596 B2
(45) Date of Patent: Apr. 27, 2010

(54) SYSTEM AND METHOD FOR MINIMIZING MRI-IMAGING ARTIFACTS

(75) Inventors: Walter R. T. Witschey, Philadelphia, PA (US); Ari Borthakur, Philadelphia, PA (US); Mark A. Elliot, Bryn Mawr, PA (US); Ravinder Reddy, Gladwyne, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 0 days.

(21) Appl. No.: 12/154,012

(22) Filed: May 19, 2008

(65) Prior Publication Data

US 2009/0009168 A1 Jan. 8, 2009

Related U.S. Application Data

(60) Provisional application No. 60/930,733, filed on May 18, 2007.

(51) Int. Cl.
*G01V 3/00* (2006.01)
(52) U.S. Cl. .................................................... 324/309
(58) Field of Classification Search ......... 324/300–322; 600/410–435
See application file for complete search history.

(56) References Cited

U.S. PATENT DOCUMENTS

| 5,103,175 | A | * | 4/1992 | Kimmich et al. | ............ | 324/309 |
|---|---|---|---|---|---|---|
| 5,281,917 | A | * | 1/1994 | Santyr | ........................ | 324/309 |
| 5,317,264 | A | * | 5/1994 | Rommel et al. | ............. | 324/309 |
| 5,327,087 | A | * | 7/1994 | Hafner et al. | ................ | 324/309 |
| 5,345,174 | A | * | 9/1994 | Kimmich et al. | ............ | 324/309 |
| 5,404,882 | A | * | 4/1995 | Santyr | ........................ | 600/410 |
| 5,420,510 | A | * | 5/1995 | Fairbanks et al. | ........... | 324/309 |
| 6,208,136 | B1 | * | 3/2001 | Smith et al. | .................. | 324/300 |
| 6,836,114 | B2 | * | 12/2004 | Reddy et al. | ................ | 324/307 |
| 7,064,545 | B2 | * | 6/2006 | Zaharchuk et al. | .......... | 324/307 |

OTHER PUBLICATIONS

Akella, S.V. et al., "Reduction of residual dipolar interaction in cartilage by spin-lock technique," Magn. Reson. Med., 52: 1103-1109 (2004).

(Continued)

*Primary Examiner*—Brij B Shrivastav
*Assistant Examiner*—Dixomara Vargas
(74) *Attorney, Agent, or Firm*—Montgomery, McCracken, Walker & Rhoads, LLP; Evelyn H. McConathy (57) ABSTRACT

Methods of, and systems for, simultaneously compensating for external-magnetic-field inhomogeneity as well as radiofrequency magnetic-field inhomogeneity in an MRI system. In one method embodiment, a pulse sequence is applied when the transmitter-reference frequency is delivered on resonance. The pulse sequence includes radiofrequency pulses which may be applied at arbitrary-excitation-flip angles that are not necessarily 90° degrees. The pulse sequence also includes spin-locking pulses applied in concert with a refocusing-composite pulse. In another method embodiment, a pulse sequence is applied when the transmitter-reference frequency is delivered off resonance. This off-resonance-pulse sequence includes radiofrequency pulses which may be applied at arbitrary-excitation-flip angles that are not necessarily 90° degrees. Sandwiched between the excitation-flip angles are at least two off-resonance-spin-lock pulses applied at an inverse phase and frequency from each other.

20 Claims, 5 Drawing Sheets

OTHER PUBLICATIONS

Aronen, H.J. et al., "3D spin-lick imaging of human gliomas," Magn. Reson. Imaging, 17: 1001-1010 (1999).

Auerbach, J.D. et al., "In vivo quantification of human lumbar disc degeneration using T-1 rho-weighted magnetic resonance imaging," Eur. Spine. J., 15: S338-344 (2006).

Avison, M. et al., "A composite spin-lock pulse for deltaB0 + B1 insensitive T1rho measurement," Proc. Soc. Magn. Reson. Med., ISMRM Annual Meeting, Seattle Washington, 2006.

Borthakur, A. et al., "Three-dimensional T1 rho-weighted MRI at 1.5 Tesla," J. Magn. Reson. Imaging, 17: 730-736 (2003).

Charagundla, S.R. et al., "Artifacts in T-1 rho-weighted imaging: correction with a self-compensating spin-locking pulse," J. Magn. Reson., 162: 113-121 (2003).

Collins, C.M. et al., "SAR and B-1 field distributions in a heterogeneous human head model within a birdcage coil," Magn. Reson. Med., 40:847-856 (1998).

Duvvuri, U. et al., Water magnetic relaxation dispersion in biological systems: the contribution of proton exchange and implications for the noninvasive detection of cartilage degradation," Proc. Natl. Acad. Sci. USA, 98: 12479-12484 (2001).

Fairbanks, E.J. et al., "One-shot measurement of spin-lattice relaxation- times in the off-resonance rotating-frame using mr-imaging, with application to breast," J. Magn. Reson. B, 106:279-283 (1995).

Garwood, M. et al., "The return of the frequency sweep: designing adiabatic pulses for contemporary NMR," J. Magn. Reson., 153: 155-177 (2003).

Grohn, H.I. et al., "Quantitative T-1p and adiabatic Carr-Purcell T-2 magnetic resonance imaging of human occipital lobe at 4T," Magn. Reson. Med., 54: 14-19 (2005).

Grohn, O.H.J. et al, "Quantitative magnetic resonance imaging assessment of cerebral ischemia in rat using on-resonance T-1 in the rotating frame," Magn. Reson. Med., 42: 268-276 (1999).

Grohn, O.H. et al., "On- and off-resonance T1rho MRI in acute cerebral ischemia of the rat," Magn. Reson. Med., 49: 172-176 (2003).

Grohn, O.H.J. et al., "Early detection of irreversible cerebral ischemia in the rat using dispersion of the magnetic resonance imaging relaxation time, T1rho," J. Cereb. Blood. Flow. Metab., 20: 1457-1466 (2000).

Johannessen W. et al., "Assessment of human disc degeneration and proteoglycan content using T1rho-weighted magnetic resonance imaging." Spine, 31: 1253-1257 (2006).

Knispel, R.R. et al., "Dispersion of proton spin-lattice relaxation in tissues," J. Magn. Reson., 14: 44/51 (1974).

Levitt, M.H. et al., "Nmr populations-inversion using a composite pulse," J. Magn. Reson., 33:473-476 (1979).

Lozano, J. et al., "Detection of posttraumatic cartilage injury using quantitative T1rho magnetic resonance imaging. A report of two cases with arthroscopic findings," J. Bone Joint Surg. Am, 88: 1349-1352 (2006).

Makela, H.I. et al., "Proton exchange as a relaxation mechanism for T-1 in the rotating frame in native and immobilized protein solutions," Biochem. Biophys. Res. Commun., 289: 813-818 (2001).

Marquardt, D.W. et al., "An algorithm for least-squares estimation of nonlinear parameters," J. Soc. Ind. Appl. Math., 11: 431-441 (1963).

Poptani H. et al, T1rho imaging of murine brain tumors at 4T. Acad Radiol., 8: 42-47 (2001).

Reddy, R. et al., "Detection of O-17 by proton T-1P dispersion imaging," J. Magn. Reson. B., 108: 276-279 (1995).

Redfield, A.G. et al., "Nuclear magnetic resonance saturation and rotary saturation in solids," Phys. Rev., 98: 1787-1809 (1955).

Regatte, RR. et al., "In vivo proton MR three-dimensional T1rho mapping of human articular carilage: initial experience.," Radiology, 229: 269-274 (2003).

Regatte, R.R. et al., "3D-T-1 rho-relaxation mapping of articular cartilage: in vivo assessment of early degenerative changes in symptomatic osteoarthritic subjects," Acad. Radiol., 11:741-749 (2004).

Rhim et al, "Time-reversal experiments in dipolar-coupled spin systems," Phys Rev B., 3:684-696 (1971).

Santyr, G.E., et al., "Variation in measured transverse relaxation in tissue resulting from spin locking with the transverse relaxation in tissue resulting from spin locking with the cpmg sequence," J. Magn. Reson., 79: 28-44 (1988).

Santyr, G.E. et al., "Spin locking for magnetic-resonance imaging with application to human-breast," Magn. Reson. Med., 12: 25-37 (1989).

Santyr, G.E. et al., "Off-resonance spin locking for MRI imaging," Magn. Reson. Med., 32: 43-51 (1994).

Sears REJ., "Off-resonance rotary spin echoes in dipolar broadened solids," Bull Am Phys Soc., 15: 275 (1970).

Sears REJ., F-19 anistropic chemical-shift in solid CFCL3. Bull Am Phys Soc., 17: 573 (1972).

Solomon, I., "Rotary Spin Echoes," Phys. Rev. Lett., 2: 301-302 (1959).

Tailor, D.R. et al., "High-resolution assessment of blood flow in murine RIF-1 tumors by monitoring uptake of H217O with proton T1rho- weighted imaging," Magn. Reson. Med., 49: 1-6 (2003).

Tailor, D.R. et al., Measuring regional blood flow in the rat brain using indirect 17O magnetic resonance imaging, Proc. Intl. Soc. Magn. Reson. Med. ISMRM-ESMRB Joint Annual Meeting, Glasgo, 356 (2001).

Tailor, D.R. et al., Indirect 17O-magnetic resonance imaging of cerebral blood flow in the rat, Magn. Reson. Med., 49: 479-487 (2003).

Torrey, H.C. et al., "Transient nutations in nuclear magnetic resonance," Phys. Rev., 76: 1059-1068 (1949).

Wheaton, A.J. et al., "Method for reduced SAR T1rho-weighted MRI," Magn. Reson. Med., 51: 1096-1102 (2004).

Wheaton, A.J. et al., "Correlation of T1rho with fixed charge density in cartilage," J. Magn Reson. Imaging, 20: 519-525 (2004).

Wheaton, A.J., et al., "Detection of changes in articular cartilage proteoglycan by T(1rho) magnetic resonance imaging," J. Orthop Res., 23: 102-108 (2005).

Xia, Y. et al., "Relaxation anisotropy in cartilage by NMR microscopy (μMRI) at 14-μm resolutions," Magn. Reson. Med., 39:941-949 (1998).

* cited by examiner

Fig. 5

SYSTEM AND METHOD FOR MINIMIZING MRI-IMAGING ARTIFACTS

CROSS-REFERENCE TO RELATED APPLICATIONS

The present patent application claims benefit of U.S. Provisional Application Ser. No. 60/930,733 filed on 18 May 2007, which is incorporated herein by reference.

STATEMENT OF GOVERNMENT INTEREST

This work was supported by NIH grants R01AR045404 and R01AR051041, and performed at a NIH supported resource center NIH RR02305). The government may have certain rights in this invention.

TECHNICAL FIELD

The present invention relates to magnetic resonance imaging (MRI), and more particularly, to a system and method for minimizing imaging artifacts produced by MRI systems.

BACKGROUND

Magnetic Resonance Imaging (MRI) is an imaging technique based in part on the absorption and emission of energy in the radio frequency range. To obtain the necessary magnetic resonance (MR) images, a patient (or other target) is placed in a magnetic resonance scanner. The scanner provides a magnetic field that causes target atoms to align with the magnetic field. The scanner also includes coils that apply a transverse magnetic field. Radio-frequency (RF) pulses are emitted by the coils, causing the target atoms to absorb energy. In response to the RF pulses, photons are emitted by the target atoms and detected as signals in receiver coils.

Radio frequency pulses delivered by the coils are precisely calibrated to deliver the appropriate amount of power to maximize tissue contrast. Emitting RF pulses with too much power, however, may result in a host of undesired effects, such as tissue or cellular damage. Specifically, high-power RF-energy levels may cause an overheating of tissues inside a patient, as well as the absorption of harmful levels of radiation. Absorption of electromagnetic energy by the tissue is described in terms of Specific Absorption Rate (SAR), which is expressed in Watts/kg. SAR in MRI is a function of many variables including pulse sequence and coil parameters and the weight of the region exposed. In the United States, for example, the recommended SAR level for head imaging is 8 Watts/kg. Consequently, government restrictions are in place limiting how much power may be delivered into a patient's tissues during RF pulses.

Several techniques, shown to be useful for pathology diagnosis, unfortunately, require substantial RF power and, consequently, SAR levels may be unacceptable for clinical use. Unfortunately, reducing the amount of power delivered to patients to meet acceptable SAR levels produces clinical images with artifacts and reduced tissue contrast. Imperfections in magnetic fields of a scanner interfere with the scanner's ability to produce high-contrast/artifact free images; especially at low RF-power levels.

One conventional technique used to compensate for these imperfections involves injecting intravenous-contrast agents into patients to delineate areas of interest. These contrast agents, however, are often contraindicated for certain patients, and can produce undesirable side effects, including the chance for an anaphylactoid reaction, among other serious risks.

Thus, presently, there is no satisfactory way to produce high-contrast-clinical images free of artifacts, within acceptable SAR levels.

SUMMARY

To solve these and other problems, the present invention described herein, introduces a method of, and system for, simultaneously compensating for external-magnetic-field inhomogeneity as well as radiofrequency magnetic-field inhomogeneity in an MRI system.

In one method embodiment, a pulse sequence is applied when the transmitter-reference frequency is delivered on resonance. The pulse sequence includes radiofrequency pulses which may be applied at arbitrary-excitation-flip angles that are not necessarily 90° degrees. The pulse sequence also includes spin-locking pulses applied in concert with a refocusing-composite pulse.

In another method embodiment, a pulse sequence is applied when the transmitter-reference frequency is delivered off resonance. This off-resonance-pulse sequence includes radiofrequency pulses which may be applied at arbitrary-excitation-flip angles that are not necessarily 90° degrees. Sandwiched between the excitation-flip angles are at least two off-resonance-spin-lock pulses applied at an inverse phase and frequency from each other.

As a result of being able to compensate for both static-magnetic and radiofrequency-field imperfections, high-contrast-clinical images free of artifacts can be produced at low radio-frequency-power levels, i.e., within acceptable SAR levels. As image artifacts are essentially eliminated in MR images, image quality is vastly improved over conventional techniques. Further, it may be possible to eliminate the need to inject intravenous-contrast agents into patients for certain studies, among other benefits.

It is noted that conventional off-resonance rotary echoes are not presently used in a clinical environment. Images produced as result of off-resonance echoes contain substantial artifacts. As a result of one embodiment of this invention, however, it is now possible to utilize off-resonance rotary echoes in a clinical setting, because MR images can now be obtained without artifacts, and at low power levels; well within acceptable SAR levels.

The foregoing summary provides an exemplary overview of some aspects of the invention. It is not intended to be extensive, or absolutely require any key/critical elements of the invention. These and other implementations will be described below when read in conjunction with the accompanying drawings.

BRIEF DESCRIPTION OF THE DRAWINGS

The detailed description is described with reference to the accompanying figures. In the figures, the left-most digit(s) of a reference number identifies the figure in which the reference number first appears.

DETAILED DESCRIPTION

Described herein is an innovative MRI system and method able to simultaneously compensate for external-magnetic-field and radiofrequency magnetic-field inhomogeneities in an MRI system.

Definitions:

In describing the compensation methods, the following terminology will be used in accordance with the definitions set forth below.

As used herein, "α" refers to a radiofrequency pulse of arbitrary flip angle (_°=degrees).

As used herein, "apply" means to transmit or to deliver a radiofrequency pulse.

As used herein, "approximately 180°" refers to an angle sufficiently close to the 180°, but may be slightly less or more than 180°, as would be appreciated by those skilled in the relevant art.

As used herein, "B0" is an external-magnetic field, which is typically a Direct Current (zero frequency) superconducting field.

As used herein, "B1" is a radiofrequency-magnetic field delivered to create magnetic-resonance images.

As used herein, "cause" means to set off an event or action, such as the delivery of a signal. As used herein, the term "causing" a pulse to be "applied," or variations thereof, refers to the act of sending instructions to hardware (to be described), from a control system (to be described) to deliver radiofrequency energy in a particular manner.

As used herein, an "inhomogeneity" refers to one or more imperfections in either the B0 or B1 fields, or both. Inhomogeneities in either field give rise to image artifacts.

As use herein, "off resonance" refers to delivering a radiofrequency pulse at a frequency different from the rate of precession of the nuclear spins.

As used herein, "on resonance" refers to a radiofrequency pulse at a frequency identical with the rate of precession of the nuclear spins.

As used herein, a "refocusing-composite pulse" refers to one or more combinations of pulses, which rewind the effects of field inhomogeneity.

As used herein, a "spin-locking pulse" refers to a long B1-radiofrequency pulse delivered to create either T1ρ, or T1ρoff (or other relaxation-time types) contrast in images.

Reference herein to "one embodiment", "an embodiment", or similar formulations herein, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

System Overview

Figure 1:
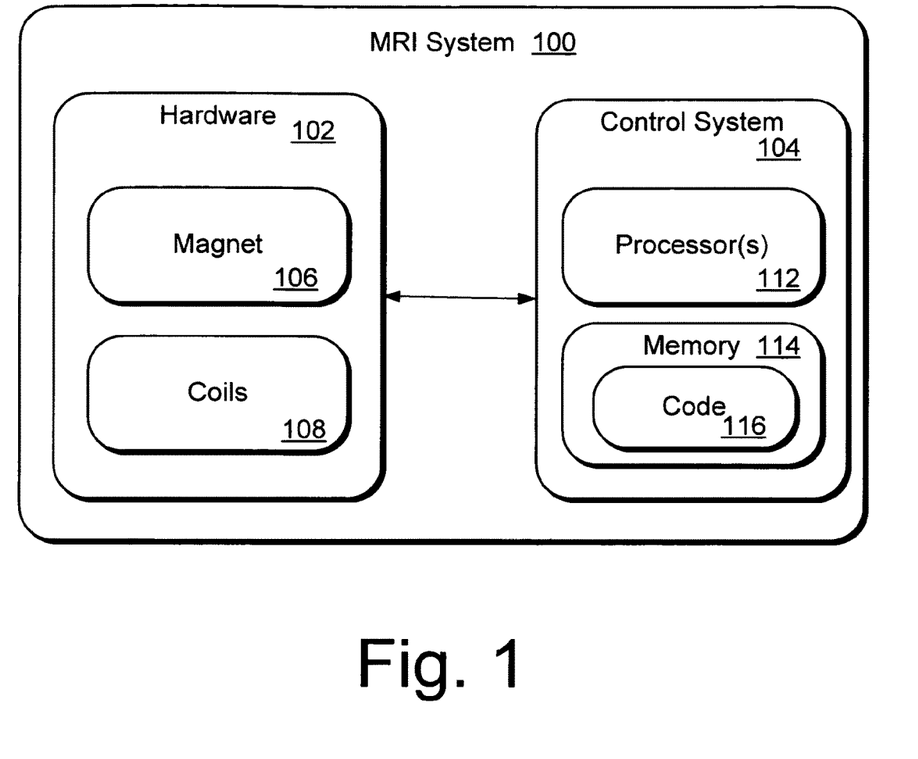
FIG. 1 illustrates an MRI system within which the present invention can be either fully or partially implemented.

FIG. 1 illustrates an MRI system 100 within which the present invention can be either fully or partially implemented. As appreciated by those skilled in the art, there are various ways to implement an MRI system 100. In one possible embodiment, MRI system 100 includes hardware components 102, and a control system 104. As is well known by those skilled in the art, typical hardware components 102 include: a magnet 106 for producing a stable and very intense magnetic field, and may include one or more coils, such as gradient coil for creating a variable field, and radiofrequency (RF) coil, for transmitting energy and encoding spatial positioning.

Control system 104 controls hardware components 102, such as RF coil for the transmitting RF pulses there from. Control system 104 may be implemented as a computer or control device, which includes at least one processor 112, and memory 114. Memory 114 may include volatile memory (e.g., RAM) and/or non-volatile memory (e.g., ROM). It is also possible for other memory mediums (not shown) having various physical properties to be included as part of control system 104.

Control system 104 may also include code 116 stored in memory 114, such as software and/or firmware that causes MRI system 100 to apply RF pulses, and acquire images.

Much of the discussion below will focus on embodiments for performing operations of control system 104—that may be embodied as code 116—used to control MRI system 100. In particular, applying RF pulses to compensate for B0 and B1 field imperfections.

As appreciated by those skilled in the art, any suitable calibration techniques may be used prior to applying RF pulses. For example, in one embodiment, MRI-scanner calibration may include three operations as follows:

For instance, a first-calibration step may involve using a scanner-frequency calibration to determine the scanner 'on-resonance' condition. This is performed by a spectroscopy experiment to determine where the resonant peak of interest occurs relative to the MRI scanner reference frequency used for RF transmission.

A second-calibration step may involve using an RF-transmitter-voltage calibration to determine the voltage-flip angle relationship for the scanner/object pair.

A third-calibration step may involve B0-field shimming by magnetic-field-gradient adjustment to improve the homogeneity of the superconducting-magnetic field. Both RF-transmitter calibration and B0-field shimming are not ideal and can result in radiofrequency-field inhomogeneity and static-field inhomogeneity, respectively.

Again, the present invention describes a system and method for generating "contrast" independent of artifacts created by field inhomogeneities, which, in practice, occur, even with proper calibration.

Exemplary Pulse Sequence Delivered on Resonance

Figure 2:
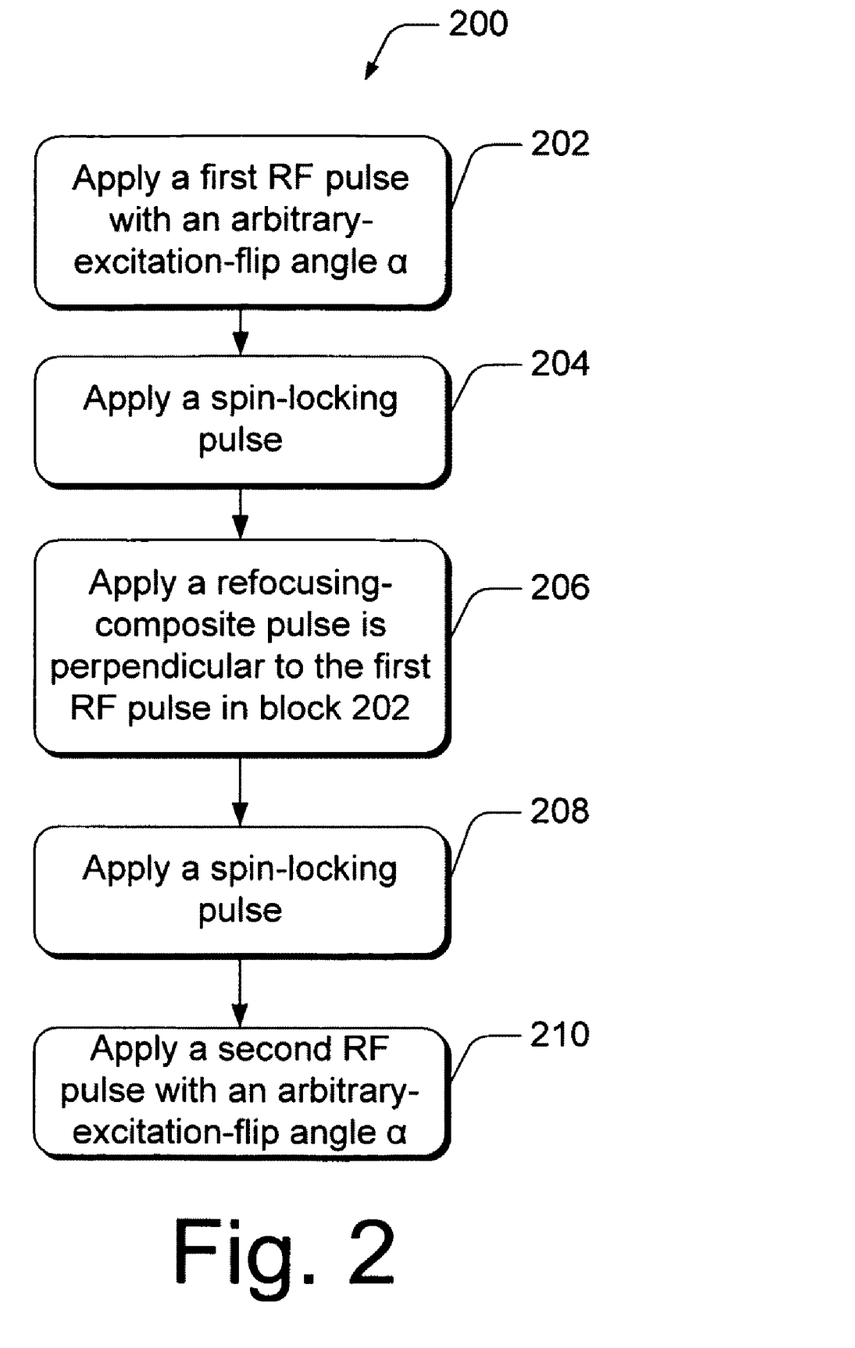
FIG. 2 is an exemplary method for simultaneously compensating for external and radiofrequency magnetic-field inhomogeneities in an MRI system, such as the system of FIG. 1.

FIG. 2 is an exemplary method 200 for simultaneously compensating for external and radiofrequency (RF) magnetic-field inhomogeneities in an MRI system, such as system 100 of FIG. 1. Specifically, method 200 describes one embodiment of a pulse sequence applied when a transmitter-reference frequency is delivered by MRI system 100 on resonance.

Method 200 includes blocks 202, 204, 206, 208, and 210 (each of the blocks represents one or more operational acts). The order in which the method is described is not to be construed as a limitation, and any number of the described method blocks may be combined in any order to implement the method. Furthermore, the method can be implemented in any suitable hardware, software, firmware, or combination thereof. Additionally, although each module in FIG. 2 is shown as a single block, it is understood that when actually implemented in the form of computer-executable instructions, logic, firmware, and/or hardware, that the functionality described with reference to it may not exist as separate identifiable block.

In block 202 of FIG. 2, a first RF pulse with an arbitrary-excitation-flip angle α is delivered. For example, control system 104 instructs hardware components 102 (e.g., causes MRI system 100) to deliver the first-RF pulse. While a 90° degree flip angle is ideally attempted, those skilled in the art having the benefit of this disclosure will appreciate that a 90° degree flip angle is not achievable due to imperfections in the B1-field. Therefore, the first RF pulse is applied at an arbitrary-excitation-flip angle α.

In one embodiment, the first RF pulse is delivered in a +x direction according to the Cartesian-coordinate system. The first RF pulse, however, is not limited to the +x direction, and may be delivered in other directions, such as +y, −x, −y, etc.

In block 204, a spin-locking pulse is applied. For example, control system 104 instructs (i.e., causes) hardware 102 to apply a special RF pulse, or "spin-locking pulse," which locks the spin magnetization along the effective RF field with a direction +y. As appreciated by those skilled the art, the spin-locking pulse, however, is not limited to the +y direction, and may be delivered in other directions, such as +x, −x, −y, etc.

Under the influence of the spin-locking pulse delivered in block 204, the magnetization produced by hardware 102 (FIG. 1) relaxes with a time constant T1ρ rather than the typical time-relaxation time constant T2. This time constant, T1ρ, provides useful contrast when images are obtained through conventional image acquisition techniques during subsequent processing, which can distinguish disease. Unfortunately, because of RF field imperfections, the magnetization may not be perfectly aligned along the spin-locking field, and will nutate (i.e., rotate) at a fixed angle to the applied RF field. In addition, the spin-locking field may not be perfectly aligned along the desired direction, because of B0 imperfections. In a reference frame which rotates at a rate proportional to the B0 field, the magnetization will nutate about a new "effective field" axis during this spin-locking pulse.

In block 206, a refocusing-composite pulse is applied perpendicular to the first RF pulse applied in block 202. That is, an approximate 180° degree pulse is applied. This refocusing-composite pulse flips the magnetization about the applied-pulse direction in the transverse plane. In one embodiment this refocusing-composite pulse is delivered along the +y direction to refocus (i.e., unwind) the detrimental effects of B0-field inhomogeneity. It should be appreciated by those skilled the art, that the refocusing-composite pulse, however, is not limited to the +y direction, and may be delivered in other directions, such as +x, −x, −y, depending on the direction of prior pulses in blocks 202, and 204.

In one embodiment, the refocusing-composite pulse is a single pulse, however, it should be appreciated by those skilled in the art that the refocusing-composite pulse may consist of more than one pulse with an aggregate direction equivalent to transmitting a single 180° degree pulse.

In block 208, another spin-locking pulse is applied. For example, control system 104 instructs (i.e., causes) hardware 102 to apply a special RF pulse, or "spin-locking pulse," which locks the spin magnetization along the effective RF field with a direction −y. As appreciated by those skilled the art, the spin-locking pulse, however, is not limited to the +y direction, and may be delivered in other directions, such as +x, −x, +y, etc., depending on the direction of previous pulses in blocks 202, 204, and 206.

In block 210, a second RF pulse with an arbitrary-excitation-flip angle α is delivered. For example, control system 104 instructs hardware components 102 (e.g., causes MRI system 100) to deliver a second-RF pulse. This second RF pulse is designed to compensate for B1-field inhomogeneity reintroduced by the 180° degree pulse of block 206.

In one embodiment, the second RF pulse is delivered in a +x direction 16 according to the Cartesian-coordinate system. The second RF pulse, however, is not limited to the +x direction, and may be delivered in other directions, such as +y, −x, −y, etc., depending on the direction of previous pulses in blocks 202, 204, 206, and 208.

In one embodiment, any of the foregoing operations may be repeated using a coronal view. As appreciated by those skilled in the art, having the benefit of this disclosure may be included as part of process 200. Alternatively, obtaining images from the perspective of the coronal view may not be performed.

While FIG. 2 shows a specific example pulse-sequence process, it should be understood by those skilled in the art, after having the benefit of this disclosure that the pulse sequence may be performed in combination with other RF pulses. Additionally, the pulse sequence may be repeated many times. The exact techniques used to deliver these pulses may vary. For example, the composite refocusing-composite pulse may be achieved by emitting smaller units of the signal over a linked series of pulses that may not necessarily be a part of the same pulse sequence. Thus, many modifications to the sequence of operations shown in FIG. 2 may achieve the same result.

Figure 3A:
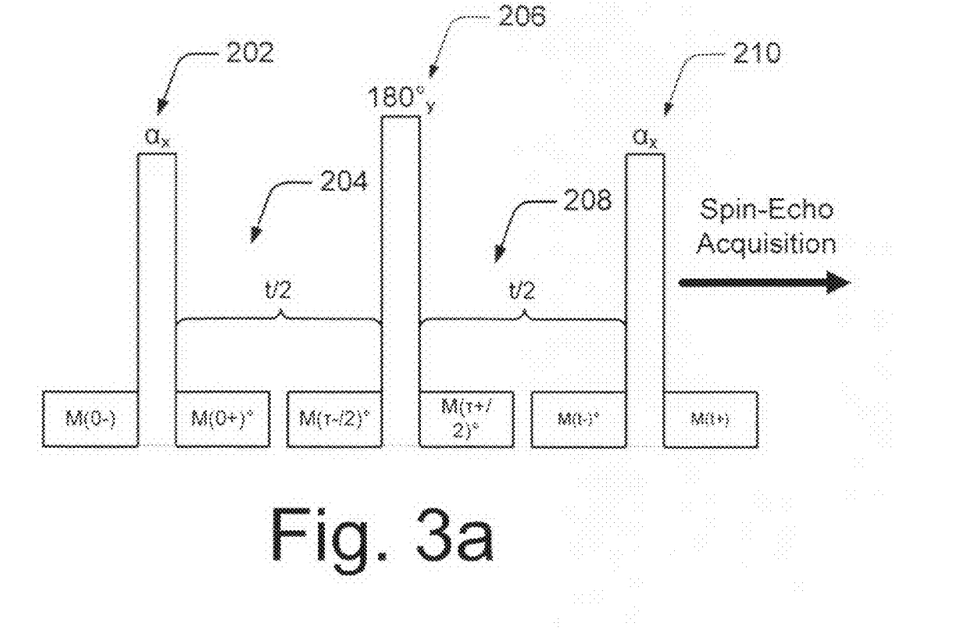
FIGS. 3a and 3b show other representative views of the operations shown in FIG. 2.
Figure 3B:
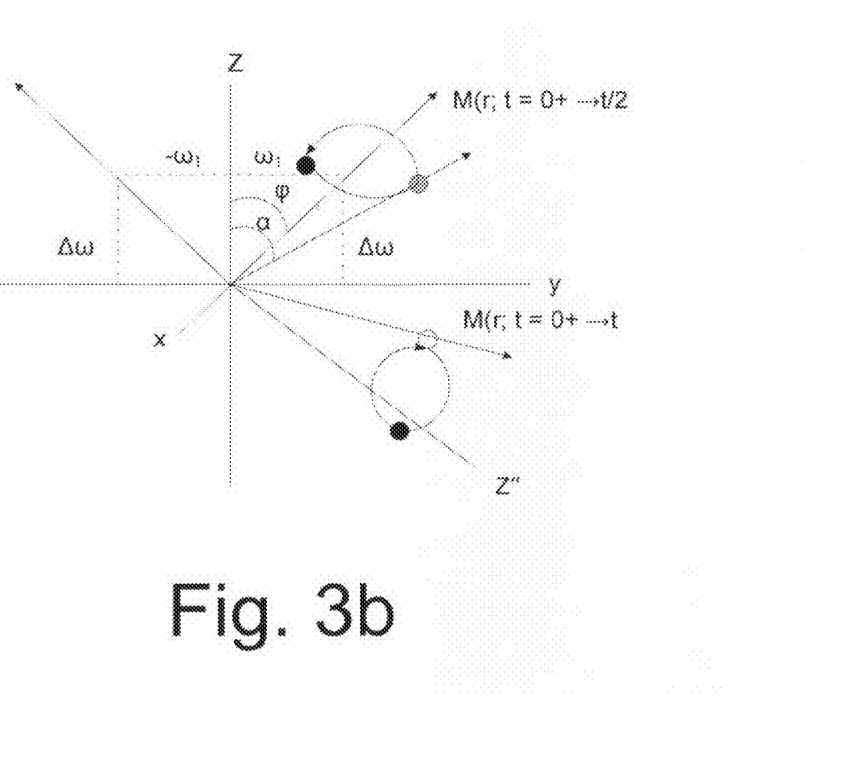

FIGS. 3a and 3b show other representative views of the operations shown in FIG. 2. As depicted in FIGS. 3a and 3b, ΔB0 insensitive composite pulses T1ρ weighted imaging and the magnetization path during each sequence is shown. As shown therein, the arbitrary-excitation-flip angle α is not 90°, and B1 insensitivity is maintained by flipping the magnetization along the −z axis.

As depicted in FIGS. 3a and 3b there is a $\Delta B_0$ and $B_1$ insensitive spin lock: $90_x - \tau/2_y - 180_y - \tau/2_{-y} - 90_x (\omega_1 >> \Delta\omega_0)$, $M(\tau^+) = -M(0^-) R_y(2\alpha) = R_y(180°)$, Alternating the phase of the last 90° pulse in the spin lock pulse cluster aligns the final magnetization along the −z-axis rather than along the +z-axis (FIG. 3b). The alternation of the phase of the final 90° pulse from −x to +x in the cluster compensates for imperfect flip angles α=90° in an inhomogeneous $B_1$ field. The expression for the full pulse propagator is the same as Eq. (22) except for the final phase shift $$M(\tau^+) = R_x(-\alpha) R_x(\phi) Rz''_2(\omega_{eff}\tau/2) R_x(-\phi) R_y(2\alpha) R_x(-\phi)$$
$$Rz''_1(\omega_{eff}\tau/2) R_x(\phi) R_x(-\alpha)(M(0^-)) \quad (26)$$

If $\omega_1 >> \Delta\omega_0$, then $\phi = 90°$ and Eq. (26) reduces to $$(\omega_1 \gg \Delta\omega_0) M(\tau^+) = \quad (27)$$
$$R_x(\alpha) R_{-y}(\omega_1\tau/2) R_y(2\alpha) \times R_y(\omega_1\tau/2)(R_x(\alpha)(M(0^-))$$

and the final longitudinal magnetization is $$(\omega_1 >> \Delta\omega_0) M_z(\tau^+) = M_0[-\sin^2(\alpha) + \cos^2(\alpha)\cos(2\alpha)] \quad (28)$$

and is identical to Eq. (24) but with the first term inverted. The implication is that is α=90°, the absolute magnetization in unaffected by the pulse phase shift. Instead, if $(\omega_1 << \Delta\omega_0)$, then magnetization is $$(\omega_1 \ll \Delta\omega_0) M(\tau^+) = \quad (29)$$
$$R_x(\alpha) R_z(\Delta\omega_0\tau/2) R_y(2\alpha) \times R_z(\Delta\omega_0\tau/2) R_x(\alpha) M(0^-)$$

The key feature of Eqs. (26) and (29) is that the final phase shift −x to +x no longer requires that $R_x(\alpha)=R_x(90°)$, however to completely reduce Eq. (29) to Eq. (20) we still require $R_y(2\alpha)=R_y(180°)$. In this case Eq (29) becomes $$(\omega_1 \ll \Delta\omega_0), M(\tau^+)=-M(0^-)$$

$$R_y(2\alpha)=R_y(180°), \tag{30}$$

Despite the inability to achieve a perfect 180° flip in practice, artifacts are less severe than in the $\Delta B_0$ insensitive spin lock. In addition, the rectangular 180° may be substituted with a composite 180° RF pulse to further reduce these artifacts [26].

Exemplary Pulse Sequence Delivered Off Resonance

Figure 4:
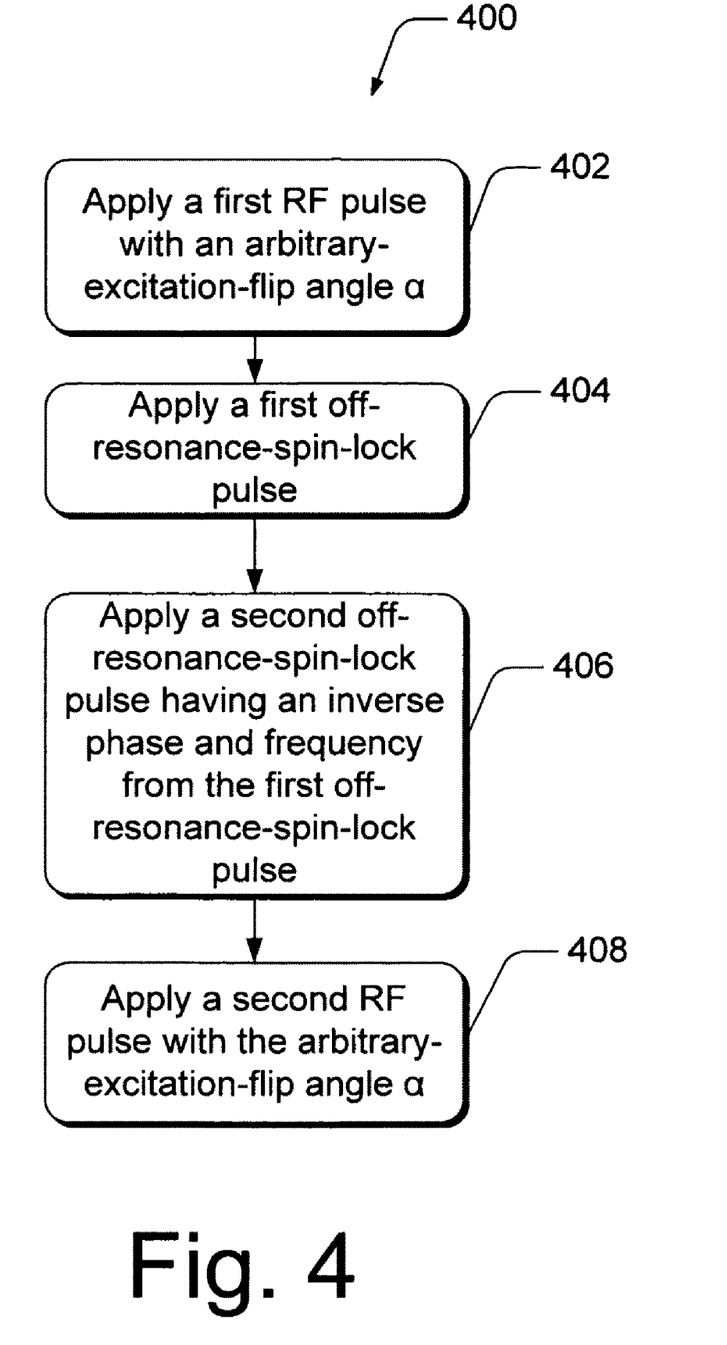
FIG. 4 shows another exemplary method for simultaneously compensating for external and radiofrequency magnetic-field inhomogeneities in an MRI system, such as system 100 of FIG. 1.

FIG. 4 shows another exemplary method 400 for simultaneously compensating for external and radiofrequency (RF) magnetic-field inhomogeneities in an MRI system, such as system 100 of FIG. 1. Specifically, method 400 describes one embodiment of a pulse sequence applied when a transmitter-reference frequency is delivered by MRI system 100 off resonance.

Method 400 includes blocks 402, 404, 406, and 408 (each of the blocks represents one or more operational acts). The order in which the method is described is not to be construed as a limitation, and any number of the described method blocks may be combined in any order to implement the method. Furthermore, the method can be implemented in any suitable hardware, software, firmware, or combination thereof. Additionally, although each module in FIG. 4 is shown as a single block, it is understood that when actually implemented in the form of computer-executable instructions, logic, firmware, and/or hardware, that the functionality described with reference to it may not exist as separate identifiable block.

In block 402 of FIG. 4, a first RF pulse with an arbitrary-excitation-flip angle α is applied. For example, control system 104 (FIG. 1) instructs hardware components 102 (FIG. 1) (e.g., causes MRI system 100) to deliver the first-RF pulse. That is, control system 104 (FIG. 1) sends an instruction to hardware 102 (FIG. 1), to deliver a radiofrequency pulse of flip angle α. Ideally, this flip angle has a desired pulse of flip angle angle $\alpha=\tan(\omega 1/\Delta\omega)$ such that the magnetization is flipped parallel to the effective field in a reference frame which rotates at a rate proportional to the B0 field. In practice, however, inhomogeneity in the B1 field will cause this flip angle to deviate from the desired α degrees.

In block 404, a first off-resonance-spin-lock pulse is applied. For example, control system 104 (FIG. 1) instructs hardware components 102 (FIG. 1) to deliver the first-off-resonance-spin-lock. That is, control system 104 (FIG. 1) sends an instruction to hardware 102 (FIG. 1), to deliver a special RF pulse or spin-locking pulse which locks the spin magnetization along the effective field with direction +y with respect to the transverse plane (x-y plane) and $\alpha=\tan(\omega 1/\Delta\omega)$ with respect to the y-z plane. It should be noted that the effective field lies oblique to the transverse plane as result of performing operations associated with block 404. This condition is known as "off-resonance spin locking" because in addition to delivering an RF pulse of direction +y, an instruction is also sent to hardware 102 (FIG. 1) to deliver the RF pulse off-resonance. That is, the RF pulse frequency is no longer exactly equal to the rate of spin rotation in the B0 field, but deviates by several Hz—kHz. Under the influence of the off-resonance spin locking pulse, the magnetization relaxes with a time constant T1rho-off rather than the typical relaxation time constant T2. This special relaxation time gives useful contrast to the image, which can distinguish disease.

While the first off-resonance-spin-lock pulse is applied is delivered in a +y direction according to the Cartesian-coordinate system. The first off-resonance-spin-lock pulse, however, is not limited to the +y direction, and may be delivered in other directions, such as −x, or −y, etc.

In block 406, a second off-resonance-spin-lock pulse having an inverse phase and frequency from the first off-resonance-spin-lock pulse is applied. For example, control system 104 (FIG. 1) instructs hardware components 102 (FIG. 1) to deliver the second-off-resonance-spin-lock. That is, control system 104 (FIG. 1) sends an instruction to hardware 102 (FIG. 1), to deliver a special RF pulse or "spin-locking pulse" which locks the spin magnetization along the effective field with direction −y with respect to the transverse plane (x-y plane), and $\alpha=\tan(\omega 1/-\Delta\omega)$ with respect to the y-z plane. It should be noted that this arrangement is different from the spin locking pulse in block 404 because the RF field is delivered off-resonance at exactly equal to the inverse of the off-resonance condition in block 404 (i.e. $\Delta\omega \rightarrow -\Delta\omega$). It is necessary that both the phase (direction) and the frequency of this RF pulse are inverted in order to refocus (or unwind) the detrimental effects of RF field inhomogeneity.

While the second off-resonance-spin-lock pulse is applied is delivered in a −y direction according to the Cartesian-coordinate system. The second-off-resonance-spin-lock pulse, however, is not limited to the −y direction, and may be delivered in other directions, such as −x, or =y, etc., depending on the direction of the previous off-resonance-spin-locking pulse.

In block 408, a second RF pulse with the arbitrary-excitation-flip angle α inverse to the arbitrary-excitation-flip angle α of the first RF pulse (of block 402) is applied. For example, control system 104 (FIG. 1) instructs hardware components 102 (FIG. 1) to deliver the second RF pulse with the arbitrary-excitation-flip angle α inverse to the arbitrary-excitation-flip angle α of the first RF pulse. That is, control system 104 (FIG. 1) sends an instruction to hardware 102 (FIG. 1), to deliver another RF pulse with amplitude ideally $\alpha=\tan(\omega 1/\Delta\omega)$, but because of RF field inhomogeneity may not be exactly α. Because of the compensating effects of block 3, however, image artifacts are removed.

One feature of the embodiment of method 400 is the use of the inverse phase and frequency in block 406. Conventional off-resonance spin locking techniques simply extended the duration in block 404 by a factor of 2, however, this does not compensate for inhomogeneities in the RF field.

While FIG. 4 shows a specific example pulse-sequence process, it should be understood by those skilled in the art, after having the benefit of this disclosure that the pulse sequence may be performed in combination with other RF pulses. Additionally, the pulse sequence may be repeated many times. The exact techniques used to deliver these pulses may vary. For example, it is possible to make operations performed in blocks 404 and 406 each any binary number of pulses of opposite phase to further compensate for field inhomogeneity.

Figure 5:
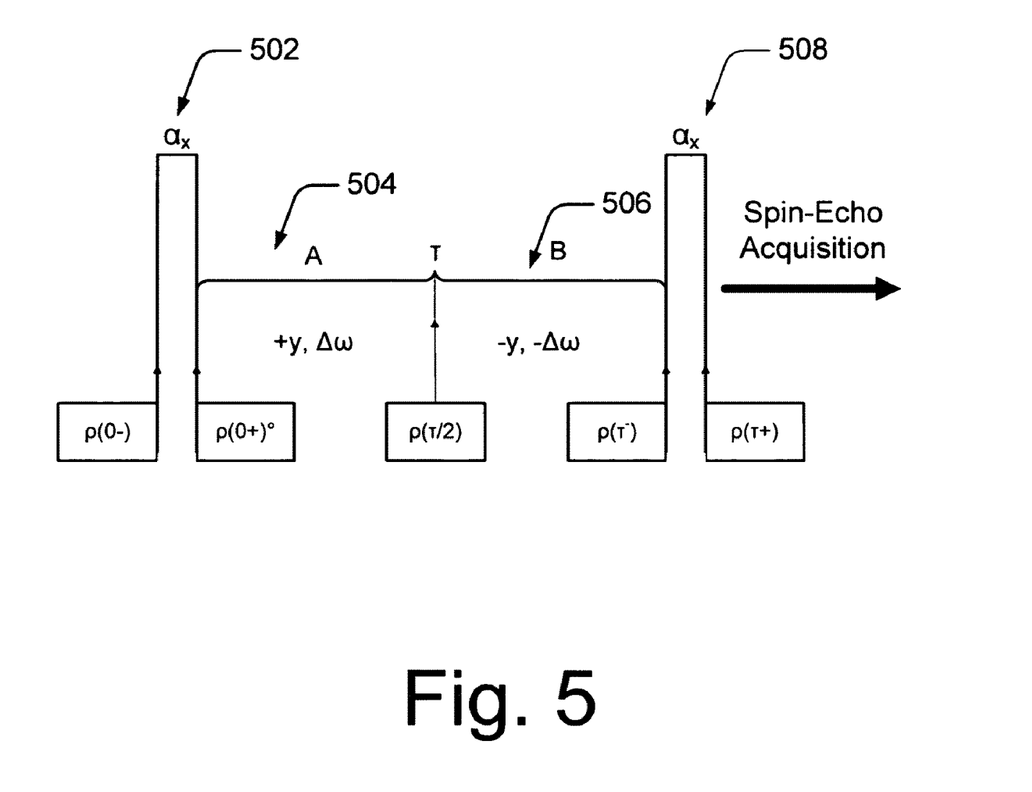
FIG. 5 shows another representative view of the operations shown in FIG. 4.

FIG. 5 shows another representative view of the operations shown in FIG. 4. As depicted in FIG. 5, the magnetization is refocused as a result of the method 400 in FIG. 4, by a frequency and phase inverted spin-locking pulse.

Exemplary methods 200 and 400 may be described in the general context of computer-executable instructions. Generally, computer-executable instructions include routines, programs, objects, components, data structures, etc. and the like that perform particular functions or implement particular abstract data types. The described methods may also be practiced in distributed computing environments where functions are performed by remote processing devices that are linked through a communications network. In a distributed computing environment, computer-executable instructions may be located in both local and remote computer storage media, including memory storage devices (computer-readable media).

The embodiments described herein are to be considered in all respects only as exemplary and not restrictive. The scope of the invention is, therefore, indicated by the subjoined Claims rather by the foregoing description. All changes which come within the meaning and range of equivalency of the Claims are to be embraced within their scope.

We claim:

1. A method of simultaneously compensating for external and radiofrequency (RF) magnetic-field inhomogeneities in an MRI system, having pulses delivered by RF scanner coil(s), the method comprising:
    causing a first RF pulse to be applied with an arbitrary-excitation-flip angle α;
    causing a refocusing-composite pulse to be applied perpendicular to the first RF pulse;
    causing a second RF pulse to be applied with the arbitrary-excitation-flip angle α, wherein the second RF pulse is perpendicular to the refocusing-composite pulse, and parallel to the first RF pulse; and
    causing a spin-locking pulse to be applied (i) between the first RF pulse and the refocusing-composite pulse, and (ii) between the refocusing-composite pulse and the second RF pulse.

2. The method as recited in claim 1, further comprising causing a transmitter reference frequency for the MRI system to be delivered on resonance.

3. The method as recited in claim 1, whereby the refocusing-composite pulse and the second RF pulse compensate for the external and RF-magnetic-field inhomogeneities.

4. The method as recited in claim 1, whereby the spin-locking pulses compensate for RF-magnetic-field inhomogeneities.

5. The method as recited in claim 1, whereby the spin-locking pulses relax the magnetization a time constant T1ρ.

6. The method as recited in claim 1, wherein the refocusing-composite pulse has a flip angle of approximately 180°.

7. The method as recited in claim 1, further comprising causing the refocusing-composite pulse to be applied along a +y direction of the Cartesian-coordinate system.

8. The method as recited in claim 1, further comprising causing the first and second RF pulses to be applied along a +x direction of the Cartesian-coordinate system.

9. The method as recited in claim 1, further comprising causing the spin-locking pulse to be applied between the first RF pulse and the refocusing-composite pulse, to be applied along a +y direction of the Cartesian-coordinate system.

10. The method as recited in claim 1, further comprising causing the spin-locking pulse to be applied between the refocusing-composite pulse and the second RF pulse, to be applied along a +y direction of the Cartesian-coordinate system.

11. The method of claim 1, wherein the inhomogeneities occur in a B0 or B1 field, or a combination thereof.

12. One or more computer-readable media having computer-readable instructions thereon which, when executed by one or more processors of a magnetic-resonance-imaging device having pulses delivered by RF scanner coil(s), cause the device to:
    apply a first RF pulse with an arbitrary-excitation-flip angle α;
    apply a refocusing-composite pulse perpendicular to the first RF pulse;
    apply a second RF pulse with the arbitrary-excitation-flip angle α, wherein the second RF pulse is perpendicular to the refocusing-composite pulse, and parallel to the first-RF pulse; and
    apply a spin-locking pulse (i) between the first RF pulse and the refocusing-composite pulse, and (ii) between the refocusing-composite pulse and the second RF pulse.

13. A system for simultaneously compensating for external and radiofrequency (RF) magnetic-field inhomogeneities in an MRI system, comprising:
    means for causing a first RF pulse to be applied with an arbitrary-excitation-flip angle α;
    means for causing a refocusing-composite pulse to be applied perpendicular to the first RF pulse;
    means for causing a second RF pulse to be applied with the arbitrary-excitation-flip angle α, wherein the second RF pulse is perpendicular to the refocusing-composite pulse, and parallel to the first-RF pulse; and
    means for causing a spin-locking pulse to be applied (i) between the first-RF pulse and the refocusing-composite pulse, and (ii) between the refocusing-composite pulse and the second RF pulse.

14. The system as recited in claim 13, whereby the refocusing-composite pulse and the second RF-pulse compensate for the external and RF-magnetic-field inhomogeneities.

15. The system as recited in claim 13, whereby the spin-locking pulses compensate for RF-magnetic-field inhomogeneities.

16. The system as recited in claim 13, whereby the spin-locking pulses relax the magnetization a time constant T1ρ.

17. The system as recited in claim 13, wherein the refocusing-composite pulse has a flip angle of approximately 180°.

18. The system as recited in claim 13, further comprising causing the refocusing-composite pulse to be applied along a +y direction of the Cartesian-coordinate system.

19. A method of simultaneously compensating for external and radiofrequency (RF) magnetic-field inhomogeneities in an MRI system having pulses delivered by RF scanner coil(s), the method comprising:
    applying a first RF pulse with an arbitrary-excitation-flip angle α;
    applying a first off-resonance-spin-lock pulse after the first RF pulse;
    applying a second off-resonance-spin-lock pulse at an inverse phase and frequency from the first off-resonance-spin-lock pulse; and
    applying a second RF pulse with the arbitrary-excitation-flip angle α inverse to the arbitrary-excitation-flip angle α of the first RF pulse.

20. The method of claim 19, wherein the inhomogeneities occur in a B0 or B1 field, or a combination thereof.

* * * * *